(12) United States Patent
Sung

(10) Patent No.: US 7,230,487 B2
(45) Date of Patent: Jun. 12, 2007

(54) AMPLIFYING DEVICE AND CONVERTER THEREOF

(75) Inventor: Kuang-Feng Sung, Feng-Yuan (TW)

(73) Assignee: Novatek Microelectronics Corp., Hsinchu (TW)

( * ) Notice: Subject to any disclaimer, the term of this patent is extended or adjusted under 35 U.S.C. 154(b) by 126 days.

(21) Appl. No.: 11/222,375

(22) Filed: Sep. 7, 2005

(65) Prior Publication Data
US 2006/0250186 A1    Nov. 9, 2006

(30) Foreign Application Priority Data
May 6, 2005    (TW) ............................... 94114663 A

(51) Int. Cl.
*H03F 3/45* (2006.01)
(52) U.S. Cl. ...................... 330/261; 330/253
(58) Field of Classification Search ................ 330/253, 330/257, 258, 261
See application file for complete search history.

(56) References Cited

U.S. PATENT DOCUMENTS

| | | | |
|---|---|---|---|
| 4,728,900 A * | 3/1988 | Nakagawara et al. ....... | 330/253 |
| 5,907,259 A * | 5/1999 | Yamada et al. .............. | 327/563 |
| 6,566,951 B1 * | 5/2003 | Merrigan et al. ........... | 330/254 |
| 6,919,767 B2 * | 7/2005 | Mechnig et al. ............ | 330/253 |

* cited by examiner

*Primary Examiner*—Henry Choe
(74) *Attorney, Agent, or Firm*—J.C. Patents

(57) ABSTRACT

A converter for an amplifying device having a first amplifier and a second amplifier is provided. The first amplifier and the second amplifier have a first tail current and a second tail current respectively. The converter includes a first compensating device and a second compensating device. The first compensating device is connected to the first amplifier, and under the control of the first tail current, determines whether to convert the first tail current to the second amplifier. The second compensating device is connected to the second amplifier, and under the control of the second tail current, determines whether to convert the second tail current to the first amplifier. There are two current paths between the first compensating device and the second compensating device and the converter can maintain the transconductance of the amplifying device at a substantially constant value.

16 Claims, 8 Drawing Sheets

AMPLIFYING DEVICE AND CONVERTER THEREOF

CROSS-REFERENCE TO RELATED APPLICATION

This application claims the priority benefit of Taiwan application serial no. 94114663, filed on May 06, 2005. All disclosure of the Taiwan application is incorporated herein by reference.

BACKGROUND OF THE INVENTION

1. Field of the Invention

The present invention relates to an amplifying device and converter thereof. More particularly, the present invention relates to an amplifying device and converter thereof having a rail-to-rail input and a substantially constant transconductance.

2. Description of the Related Art

A conventional operational amplifier can be used to amplify the difference between two input signals. In general, the output voltage of a voltage operational amplifier is equal to the difference between the non-inverted input voltage and the inverted input voltage with multiplication by the voltage gain of the operational amplifier. For an ideal voltage operational amplifier, the input impedance is relatively high and the output impedance approaches zero. On the other hand, the output current of an operational transconductance amplifier (OTA) is equal to the difference between the non-inverted input voltage and the inverted input voltage with multiplication by the transconductance gain of the operational amplifier. For an ideal operational amplifier, both the input impedance and the output impedance are relatively high.

To obtain an operational transconductance operation amplifier with rail-to-rail input using the conventional technique (that is, the output voltage range is quite close to the voltage range of the input power), the input range has to be expanded. FIG. 1 is a circuit diagram of a conventional operational transconductance amplifier. As shown in FIG. 1, the operational transconductance amplifier 100 is formed by connecting a P-channel operational transconductance amplifier 102 and an N-channel operational transconductance amplifier 104 together. The non-inverted input terminal (the non-inverted signal being $V_+$) of the operational transconductance amplifier 100 is connected to the non-inverted input terminals of the operational amplifiers 102 and 104. The inverted input terminal (an inverted signal being V−) of the operational transconductance amplifier 100 is connected to the inverted input terminals of the operational amplifiers 102 and 104. The output terminal of the operational transconductance amplifier 100 is connected to an output terminal $I_{out}$.

As shown in FIG. 1, when the common mode signal $V_{com}$ (defined as the average value between $V_+$ and $V_−$) of the input signals $V_+$ and $V_−$ is high enough to approach the highest voltage of the input power source of the operational transconductance amplifier 100, the P-channel operational transconductance amplifier 102 is shut down and yet the N-channel operational transconductance amplifier 104 can still be in operation. Contrarily, when the common mode signal Vcom is low enough to approach the lowest voltage of the input power source of the operational transconductance amplifier 100, the N-channel operational transconductance amplifier 104 is shut down and yet the P-channel operational transconductance amplifier 102 can still be in operation. Therefore, the input range of the operational transconductance amplifier 100 is larger than that of the operational amplifier 102 or the operational amplifier 104.

However, in addition to expanding the input range of the operational amplifier, the transconductance of a conventional operational amplifier must be maintained to have a substantially constant value. Because of this, there is a need to improve the operational transconductance amplifier in FIG. 1 so that a substantially constant transconductance is obtained. Aside from improving the design of a conventional operational amplifier, it is important to reduce the complexity of circuit design and minimize the layout area of devices so that the operational amplifier can be produced at a lower cost.

SUMMARY OF THE INVENTION

Accordingly, at least one objective of the present invention is to provide a converter for an amplifying device such that the converter provides the amplifying device with a substantially constant transconductance and rail-to-rail input. The number of components and the layout area of the converter can be reduced.

At least a second objective of the present invention is to provide an amplifying device having a converter for providing the amplifying device with substantially constant transconductance and rail-to-rail input. Furthermore, the converter is optimized to use the smallest number of components and hence reduce the required layout area.

To achieve these and other advantages and in accordance with the purpose of the invention, as embodied and broadly described herein, the invention provides a converter for an amplifying device having a first amplifier and a second amplifier. The first amplifier and the second amplifier have a first tail current and a second tail current respectively. The converter comprises a first compensating device and a second compensating device. The first compensating device is connected to the first amplifier, and under the control of the first tail current, to determine whether to convert the first tail current to the second amplifier. The second compensating device is connected to the second amplifier, and under the control of the second tail current, to determine whether to convert the second tail current to the first amplifier. There are two current paths between the first compensating device and the second compensating device and the converter can maintain the transconductance of the amplifying device at a substantially constant value.

The present invention also provides an amplifying device comprising a first amplifier, a second amplifier and a converter. The first amplifier has N differential input pairs and at least an output terminal, where N is a positive integer. Similarly, the second amplifier has N differential input pairs and at least an output terminal. The differential input pairs of the first amplifier are connected to their corresponding differential input pairs of the second amplifier. The first amplifier and the second amplifier have a first tail current and a second tail current respectively. The converter further comprises a first compensating device and a second compensating device. The first compensating device is connected to the first amplifier, and under the control of the first tail current, to determine whether to convert the first tail current to the second amplifier. The second compensating device is connected to the second amplifier, and under the control of the second tail current, to determine whether to convert the second tail current to the first amplifier. There are two current paths between the first compensating device and the second compensating device and the converter can maintain the transconductance of the amplifying device at a substantially constant value.

In one embodiment of the present invention, the amplifying device is a rail-to-rail input amplifying device.

In one embodiment of the present invention, when a common mode signal of the input signal of the amplifying device is in a first range, the first compensating device does not operate while the second compensating device converts the second tail current to the first amplifier. On the other hand, when the common mode signal of the input signal of the amplifying device is in a second range, the second compensating device does not operate while the first compensating device converts the first tail current to the second amplifier. When a common mode signal of the input signal of the amplifying device is between the first range and the second range, both the first compensating device and the second compensating device do not operate.

In one embodiment of the present invention, the first compensating device or the second compensating device comprises a current mirroring device.

In one embodiment of the present invention, the number of transistors used in the first compensating device or the second compensating device is less than or equal to 2N+1.

In one embodiment of the present invention, the first amplifier and the second amplifier each comprises an amplifier or an operational amplifier. In another embodiment of the present invention, the amplifier or operational amplifier further comprises a differential amplifier, a differential difference amplifier, a transconductance amplifier or a voltage amplifier.

In brief, the present invention provides a converter having a first compensating device and a second compensating device. The first compensating device is connected to the first amplifier for receiving the first tail current and determining whether to convert the first tail current to the second amplifier. Similarly, the second compensating device is connected to the second amplifier for receiving the second tail current and determining whether to convert the second tail current to the first amplifier. In one embodiment of the present invention, there are two current paths between the first compensating device and the second compensating device and the number of devices constituting the converter is optimized so that the layout area of the converter can be reduced. Furthermore, the converter of the present invention is able to maintain the transconductance of the amplifying device at a substantially constant value. In other words, the amplifying device of the present invention provides a rail-to-rail input as well as a substantially constant transconductance.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
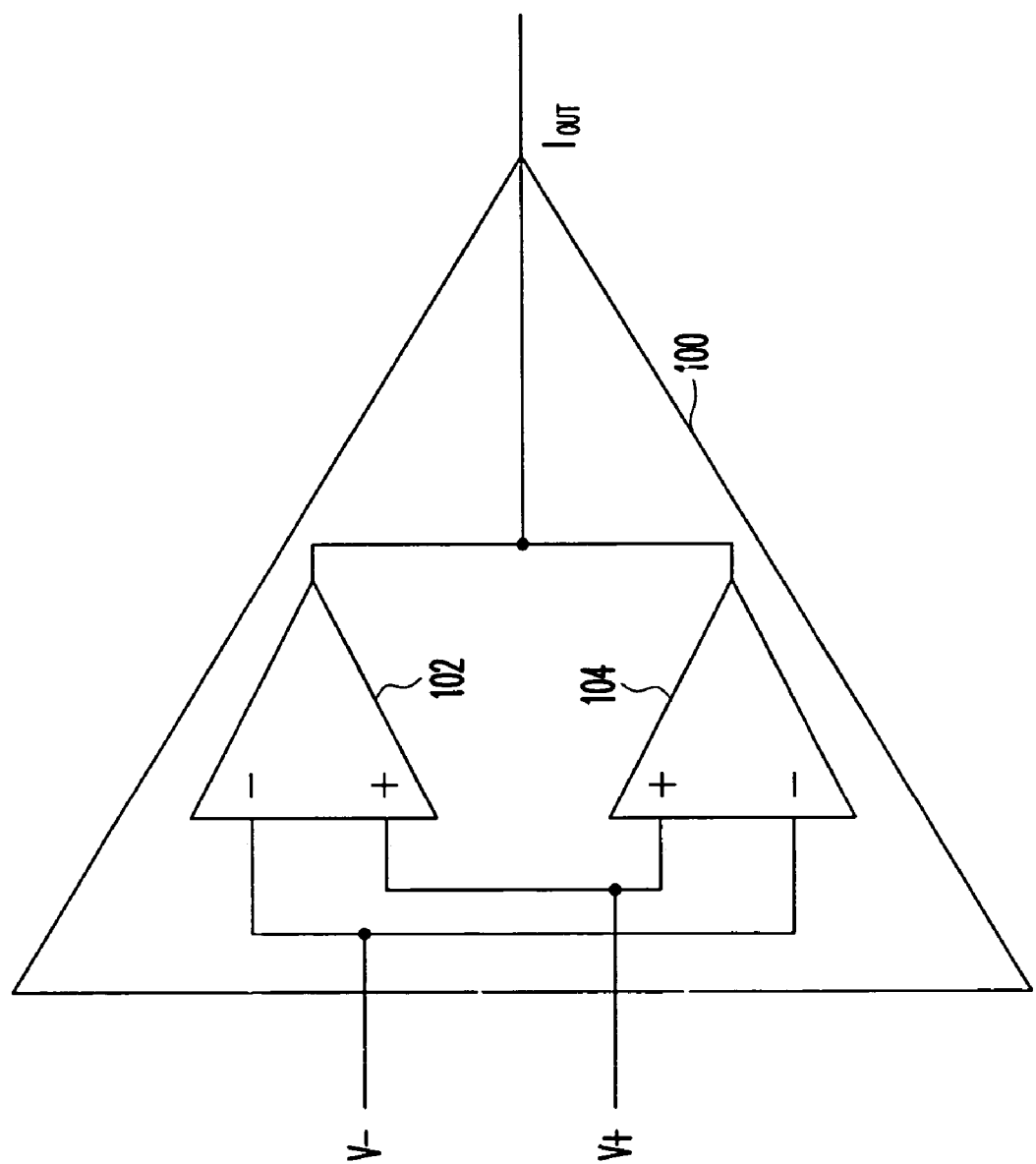
FIG. 1 is a circuit diagram of a conventional operational transconductance amplifier.

Reference will now be made in detail to the present preferred embodiments of the invention, examples of which are illustrated in the accompanying drawings. Wherever possible, the same reference numbers are used in the drawings and the description to refer to the same or like parts.

Figure 2:
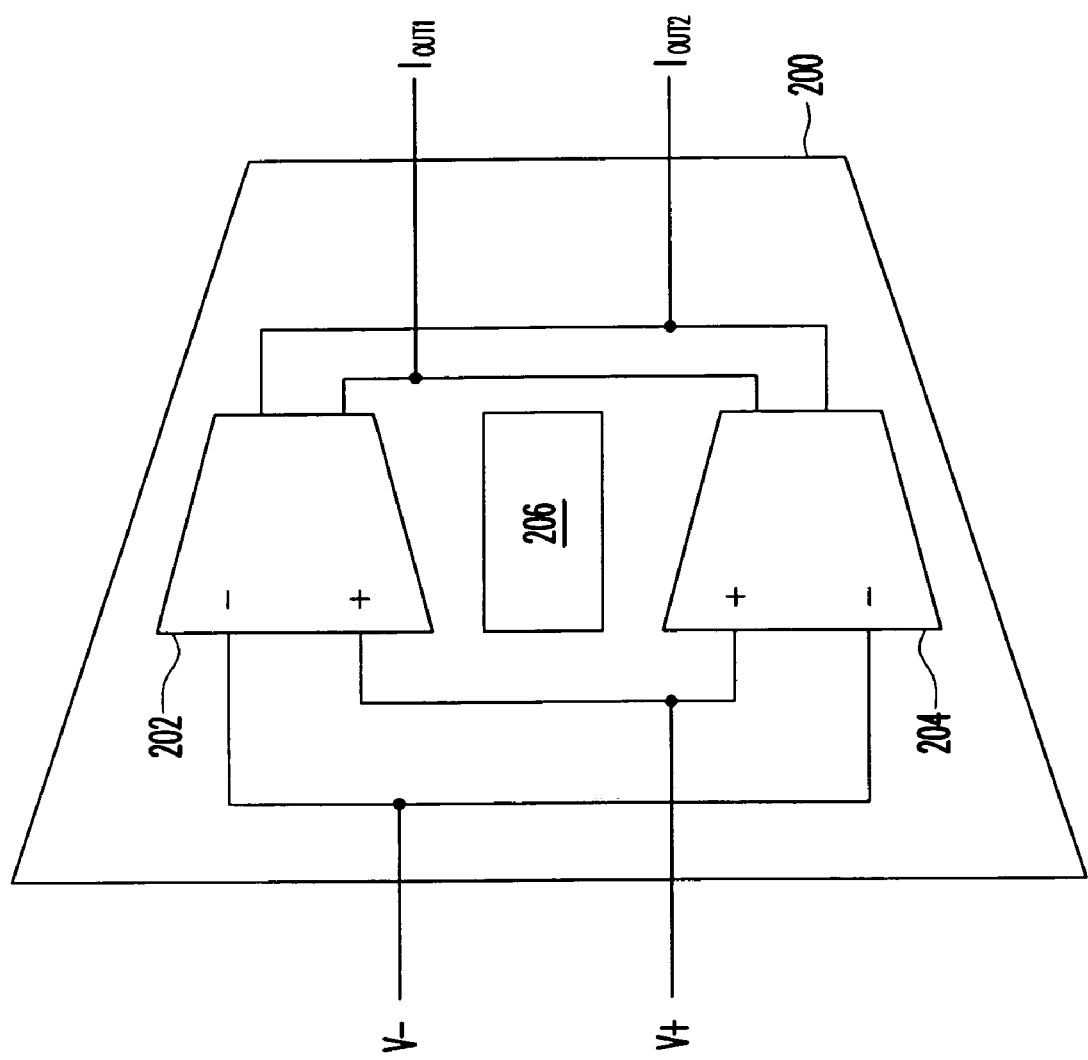
FIG. 2 is a diagram of an operational amplifying device having a differential input pair.

FIG. 2 is a diagram of an operational amplifying device having a differential input pair. As shown in FIG. 2, the operational amplifying device 200 comprises a first operational amplifier 202, a second operational amplifier 204 and a converter 206, for example. In one embodiment of the present invention, the operational amplifiers 202 and 204 may include all types of amplifiers or operational amplifiers, for example, a differential amplifier, a differential difference amplifier, a transconductance amplifier or a voltage amplifier. Furthermore, the operational amplifier 202 or 204 can have one or more outputs. For example, in FIG. 2, the operational amplifying device 200 has two output terminals for outputting signals $I_{out1}$ and $I_{out2}$ respectively.

As shown in FIG. 2, the non-inverted input terminal (the non-inverted signal is $V_+$) of the operational amplifying device 200 is connected to the non-inverted input terminal of the respective operational amplifiers 202 and 204. The inverted input terminal (the inverted signal is $V_-$) is connected to the inverted input terminal of the respective operational amplifiers 202 and 204. Meanwhile, the two output terminals (having the signal $I_{out1}$ and $I_{out2}$) are connected to their corresponding output terminals of the operational amplifiers 202 and 204. In addition, in one embodiment of the present invention, the operational amplifiers 202 and 204 can be an N-channel and a P-channel operational amplifier or vice versa. It should be noted that FIG. 2 only shows one of the embodiments and should not be used to limit the scope of the present invention.

Figure 3:
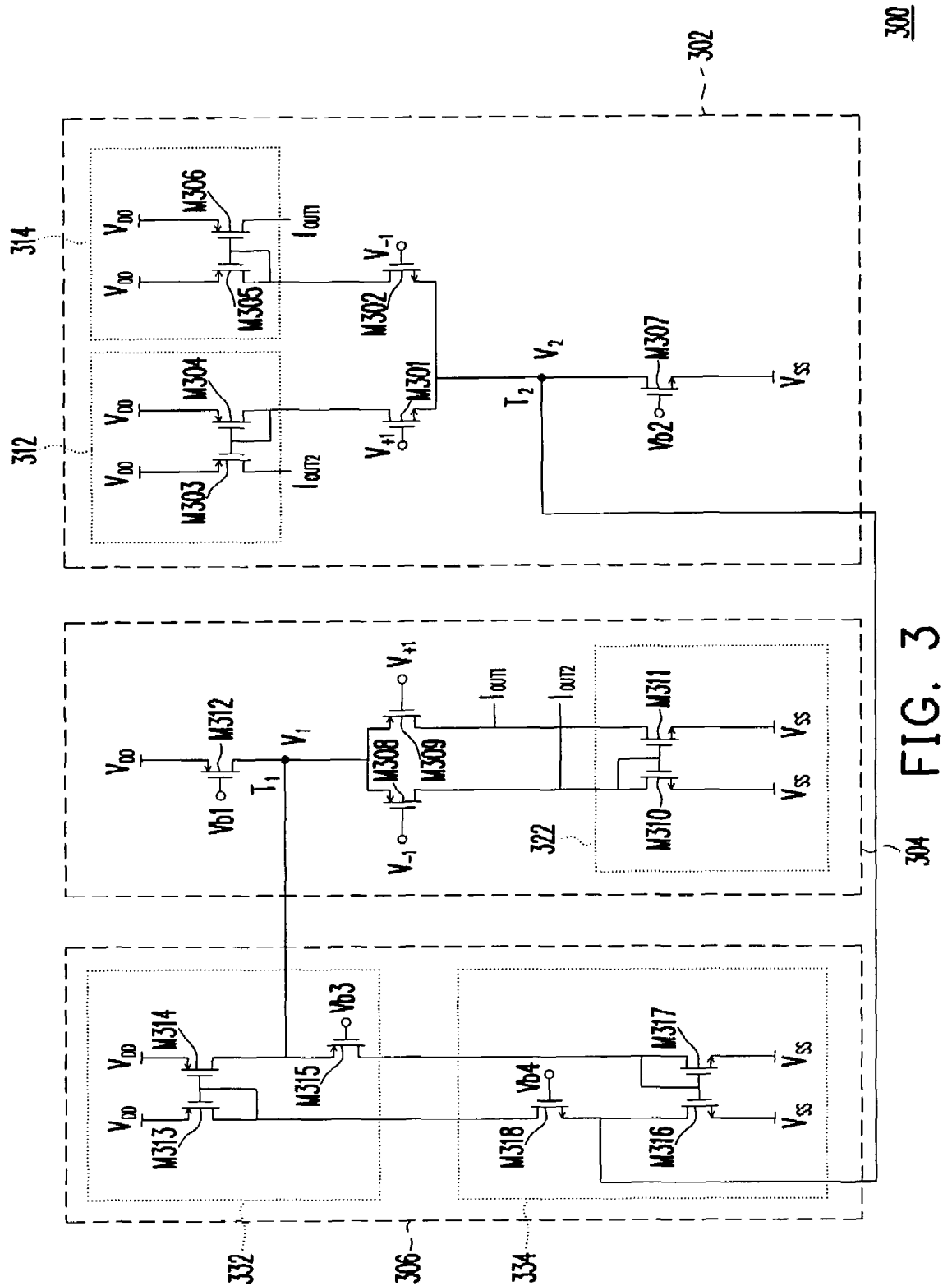
FIG. 3 is a circuit diagram of an operational amplifying device having a differential input pair.

FIG. 3 is a circuit diagram of an operational amplifying device having a differential input pair. As shown in FIG. 3, the operational amplifying device 300 comprises a first operational amplifier 302, a second operational amplifier 304 and a converter 306, respectively corresponding to the first operational amplifiers 202, the second operational amplifier 204 and the converter 206 in FIG. 2. Furthermore, the method of connection as shown in FIG. 3 is identical or similar to the one in FIG. 2.

In the present example, the operational amplifier 302 comprises a differential input pair M301 and M302, a current source M307 and a pair of current mirrors 312 and 314. The current mirror 312 comprises a pair of transistors M303 and M304 and the current mirror 314 comprises another pair of transistors M305 and M306. In the present example, the transistors M301 and M302 are NMOS transistors, for example. Therefore, the differential input pairs M301 and M302 are N-channel differential input pairs and the operational amplifier 302 is an N-channel operational amplifier.

In the present example, the operational amplifier 304 comprises a differential input pair of M308 and M309, a current source M312 and a current mirror 324. The current mirror 324 comprises a pair of transistors M310 and M311. In the present example, the transistors M308 and M309 are PMOS transistors, for example. Therefore, the differential input pair of M308 and M309 is P-channel differential input pair and the operational amplifier 304 is a P-channel operational amplifier.

In the present example, the converter 306 comprises a first current mirroring device 332 (comprising transistors M313 to M315) and a second current mirroring device 334 (comprising transistors M316 to M318). The converter 306 can be used to convert the tail current of the differential input pairs M301 and M302 to the differential input pairs M308 and M309 or vice versa. The gate signals Vb1 and Vb2 fed to the gate of the current sources M312 and M307 can be used to set the tail current of the differential input pair of M308 and M309 and the tail current of the differential input pair of M301 and M302 individually. The signals Vb3 and Vb4 fed to the gate of the transistors M315 and M318 can be used to set the bias of the first and the second current mirroring devices 332 and 334.

In the present example, when the common mode signal $V_{com}$ (for example, defined as the average value between $V_+$ and $V_-$) of the input signals $V_+$ and $V_-$ is between the highest voltage (for example, $V_{DD}$ in FIG. 3) and the lowest voltage (for example, $V_{SS}$ in FIG. 3 and $V_{SS}$ is a ground at 0V in the present embodiment) of the input power source of the operational amplifying device 300, the differential input pair of M301 and M302 and the differential input pair of M308 and M309 operate simultaneously. At this moment, the total transconductance $g_{mt}$ of the operational amplifying device 300 is the sum of the transconductance $g_{mn}$ of the differential input pair of M301 and M302 and the transconductance $g_{mp}$ of the differential input pair of M308 and M308. The quantity of the transconductance can be represented by the following formula:

$$g_{mn} = g_{mp} = g_m = \sqrt{2\mu C_{ox} \frac{W}{L} I} \quad (1)$$

where $\mu$ is the mobility, $C_{ox}$ is the capacitance of the oxide layer, W and L are the width and length of the device in unit of $\mu m$, and I is the quantity of the tail current. Thus, when the common mode signal $V_{com}$ is between the highest voltage and the lowest voltage of the input power to the operational amplifying device 300, the total of transconductance is represented by the following formula:

$$g_{mt1} = 2g_m = 2\sqrt{2\mu C_{ox} \frac{W}{L} I} \quad (2)$$

When the common mode signal $V_{com}$ is high enough to approach the highest voltage of the input power to the operational amplifying device 300, the P-channel differential input pair of M308 and M309 can not operate. In this state, the voltage (the voltage $V_1$ at the terminal $T_1$) at the source terminals of the transistors M308 and M309 is higher than the voltage of the signal Vb3. Hence, the tail current I flowing through the transistor M312 will pass via the transistor M315 through the second current mirroring device 334 into the N-channel differential input pair of M301 and M302. To obtain a total transconductance identical to the one stipulated in formula (2), the external ratio of the transistors M316 and M317 or M316: M317 should be 1:3. Therefore, the current flowing into the N-channel differential input pair of M301 and M302 is three times of the tail current I flowing through the transistor M307. As a result, the current flowing through the terminal T2 of the N-channel differential input pair of M301 and M302 is 4 I. According to the formula (1), when the common mode signal Vcom is high enough to approach the highest voltage of the input power source of the operational amplifying device 300, the total transconductance is:

$$g_{mt2} = \sqrt{2\mu C_{ox} \frac{W}{L} 4I} = 2\sqrt{2\mu C_{ox} \frac{W}{L} I} = 2g_m \quad (3)$$

When the common mode signal $V_{com}$ is low enough to approach the lowest voltage of the input power to the operational amplifying device 300, the N-channel differential input pair of M301 and M302 can not operate. In this state, the voltage (the voltage $V_2$ at the terminal $T_2$) at the source terminals of the transistors M301 and M302 is lower than the voltage of the signal Vb4. Hence, the tail current I flowing through the transistor M307 will pass via the transistor M318 through the second current mirroring device, which comprises the transistors M313 and M314, and enters into the P-channel differential input pair of M308 and M309. To obtain a total transconductance identical to the one stipulated in formula (2), the external ratio of the transistors M313 and M314 or M313: M314 should be 1:3. Therefore, the current flowing into the P-channel differential input pair of M308 and M309 is three times of the tail current I flowing through the transistor M312. As a result, the current flowing through the terminal T1 of the P-channel differential input pair of M308 and M309 is 4I. According to the formula (1), when the common mode signal Vcom is low enough to approach the lowest voltage of the input power source of the operational amplifying device 300, the total transconductance is:

$$g_{mt3} = \sqrt{2\mu C_{ox} \frac{W}{L} 4I} = 2\sqrt{2\mu C_{ox} \frac{W}{L} I} = 2g_m \quad (4)$$

In summary, the aforementioned example provides a converter 306 with a first current mirroring device 332 and a second current mirroring device 334. The first current mirroring device 332 can receive the tail current of the differential input pair of M308 and M309 and convert to the differential input pair of M301 and M302. Contrarily, the second current mirroring device 334 can receive the tail current from the differential input pair of M301 and M302 and convert to the differential input pair of M308 and M309. Hence, no matter what the input signal to the operational amplifying device 300 is, it is any value within the range between the highest voltage and the lowest value, the transconductance of the operational amplifying device 300 can be maintained at a substantially constant value. In other words, the operational amplifying device in FIG. 3 provides rail-to-rail input as well as a substantially constant transconductance.

Figure 4:
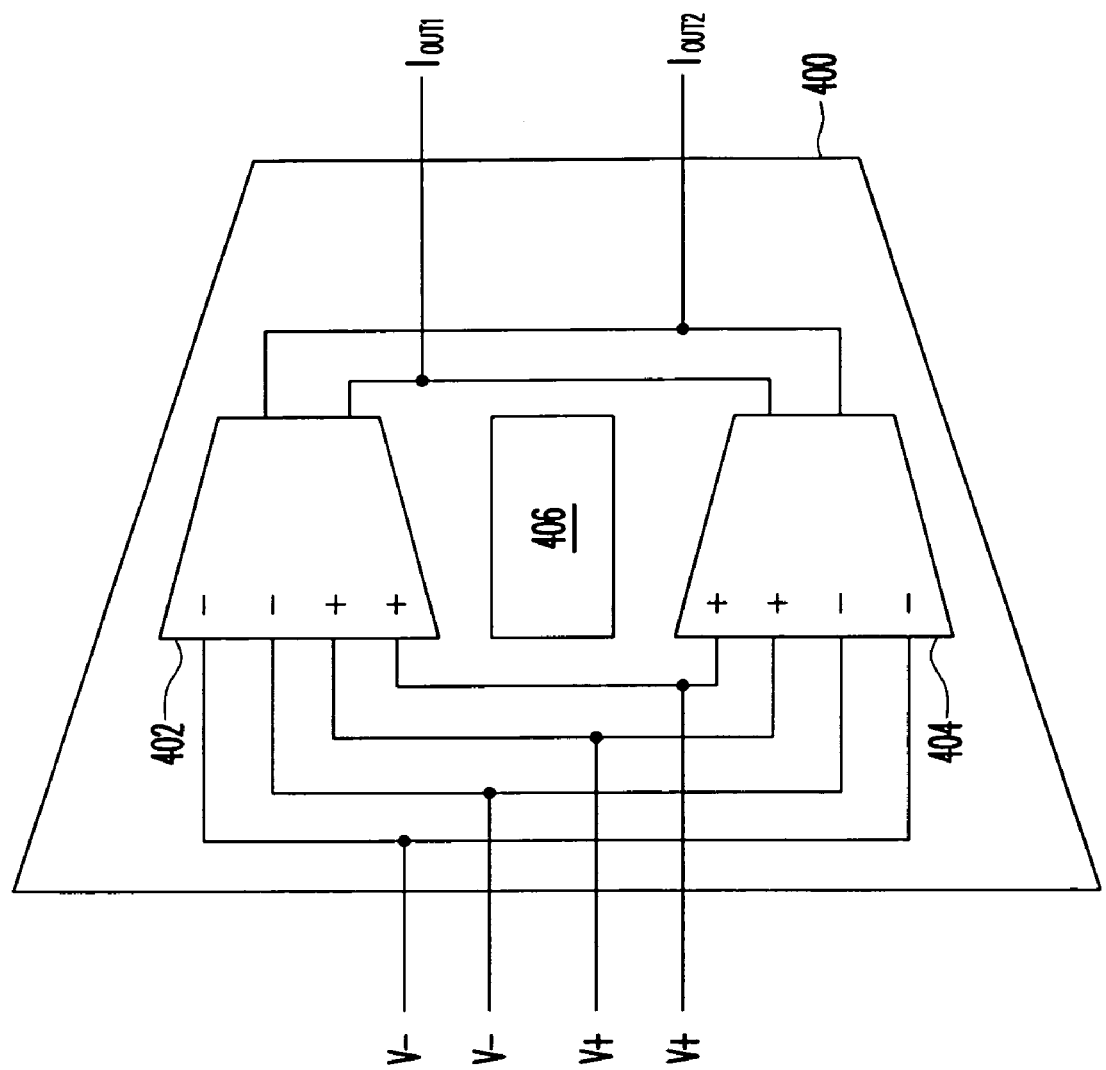
FIG. 4 is a diagram of an operational amplifying device having two differential input pairs.

FIG. 4 is a diagram of an operational amplifying device having two differential input pair. The operational amplifying device 400 in FIG. 4 includes, for example, a pair of operational amplifiers 402 and 404 each having a differential input pair and a converter 406. In one embodiment of the present invention, the operational amplifiers 402 and 404 may include all types of amplifiers or operational amplifiers, for example, a differential amplifier, a differential difference amplifier, a transconductance amplifier or a voltage amplifier. Furthermore, the operational amplifier 402 or 404 can have one or more outputs. For example, in FIG. 4, the operational amplifying device 400 has two output terminals for outputting signals $I_{out1}$ and $I_{out2}$ respectively.

Figure 5:
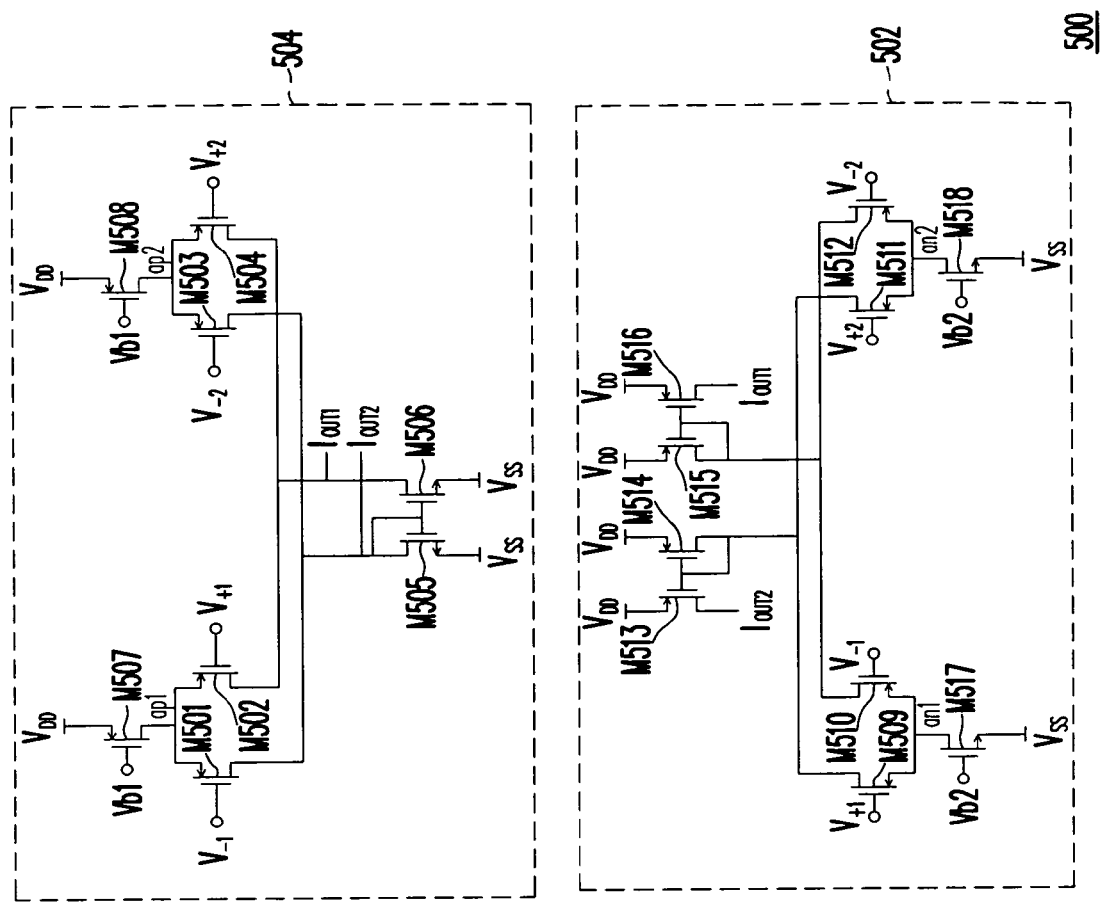
FIG. 5 is a circuit diagram of an operational amplifying device having two differential input pairs.
Figure 5:
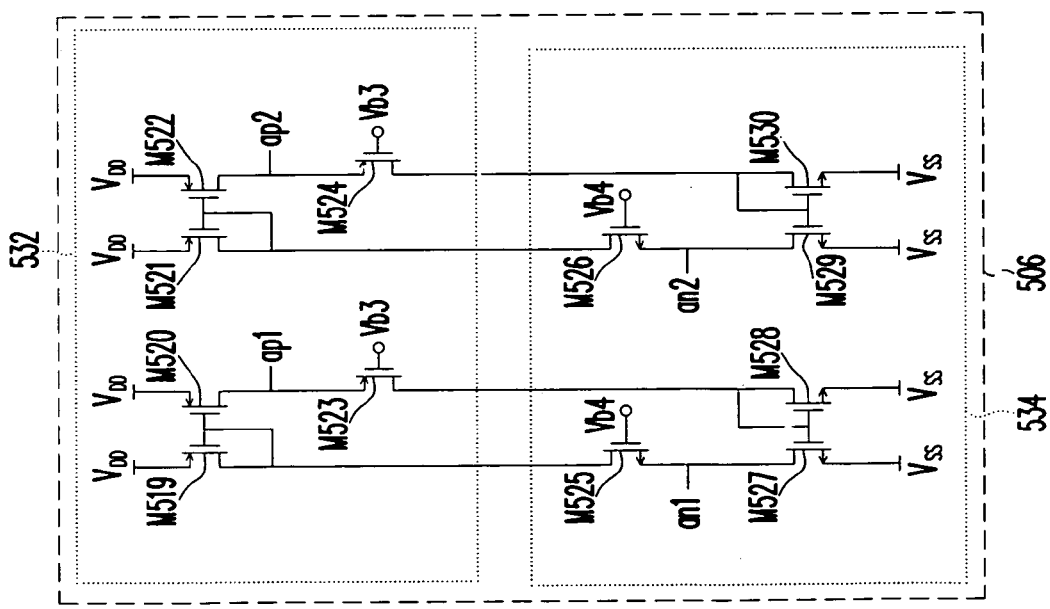

FIG. 5 is a circuit diagram of an operational amplifying device having two differential input pairs. The circuit diagram in FIG. 5 can be regarded as an embodiment of the operational amplifying device 440 in FIG. 4. The operational amplifying device 500 comprises, for example, a first operational amplifier 502, a second operational amplifier 504 and a converter 506, respectively corresponding to their counterparts such as the first operational amplifiers 402, the second operational amplifier 404 and the converter 406 in FIG. 4. The method of connection in FIG. 5 is also similar or identical to the one in FIG. 4. Furthermore, the converter 506 has a first current mirroring device 535 and a second current mirroring device 534.

With the provision of the converter 506 as shown in FIG. 5, the tail current of the operational amplifier 502 can be converted to the operational amplifier 504 or vice versa. Therefore, no matter what the value of the input signal of the operational amplifying device 500 is between the highest voltage and the lowest voltage, the transconductance of the operational amplifying device 500 can be maintained at a substantially constant value. The needed condition is that the external ratios of the transistor pairs of M520: M521, M522: M523, M528: M529 and M530: M531 are 1:1.5. In other words, the operational amplifying device 500 has both rail-to-rail input and a substantially constant transconductance.

Figure 6:
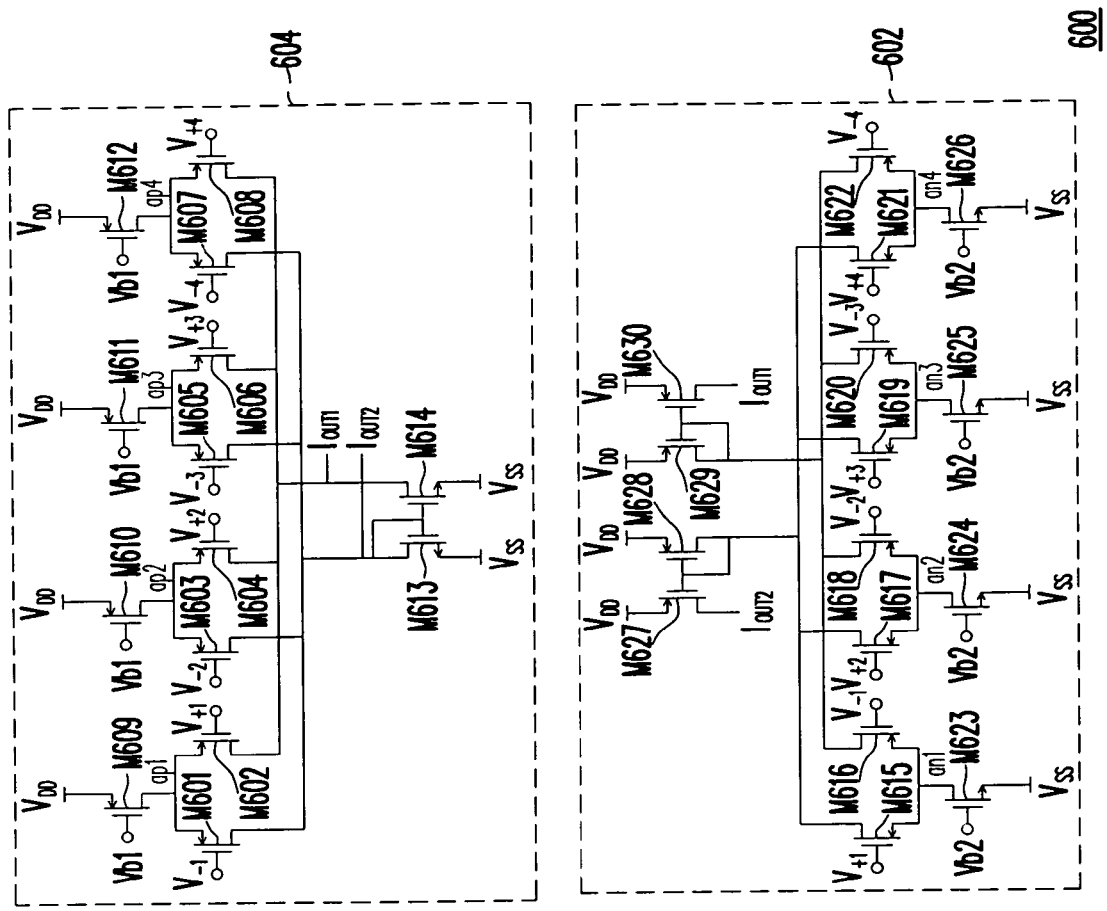
FIG. 6 is a circuit diagram of an operational amplifying device having four differential input pairs.
Figure 6:
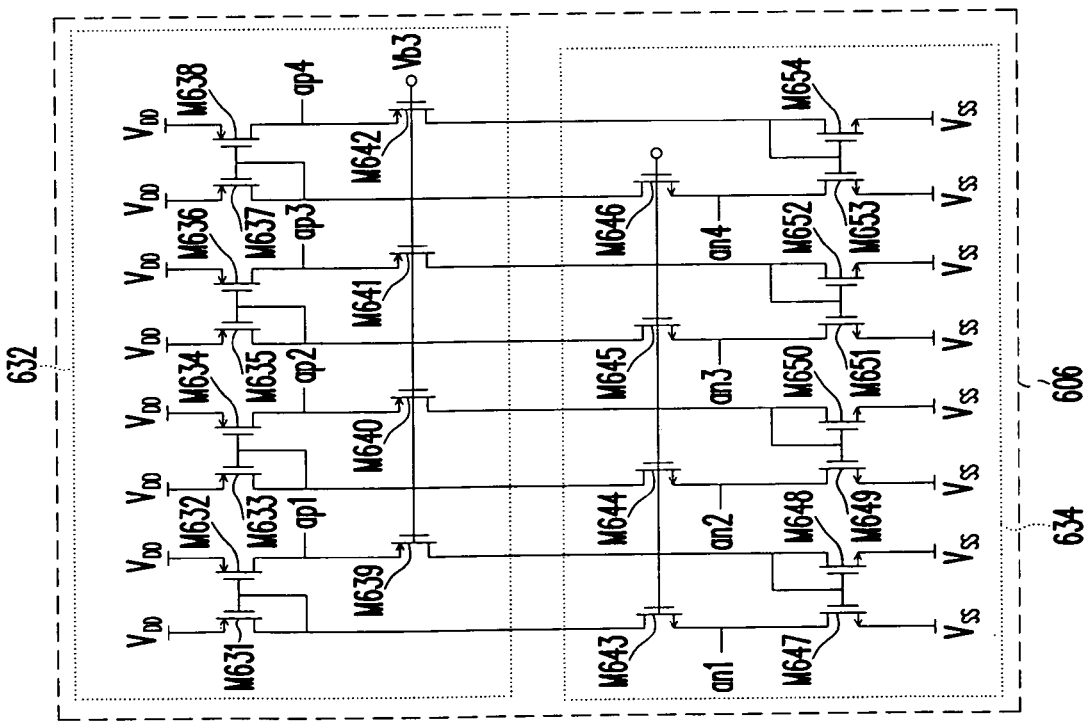

In summary, the converter 306 with a single differential input pair as shown in FIG. 3 has two main current paths and 6 transistors altogether while the converter 506 with two differential input pairs as shown in FIG. 5 has 4 main current paths and 12 transistors altogether. In the present invention, the main current path is defined as the current path between the first current mirroring device and the second current mirroring device of the converter. FIG. 6 is a circuit diagram of an operational amplifying device having four differential input pairs. As shown in FIG. 6, there are 8 main current paths and 24 transistors between the first current mirroring device 632 and the second current mirroring device 634 of the converter 606. It can be seen that two additional main current paths and 6 additional transistors are needed in the converter for each additional differential input pair. The conclusion is that the number of transistors needed in the converter is increased substantially when the number of differential input pair in the operational amplifying device is increased. Thus, it is necessary to simplify the circuit and reduce the number of devices and layout area in the design.

Figure 7:
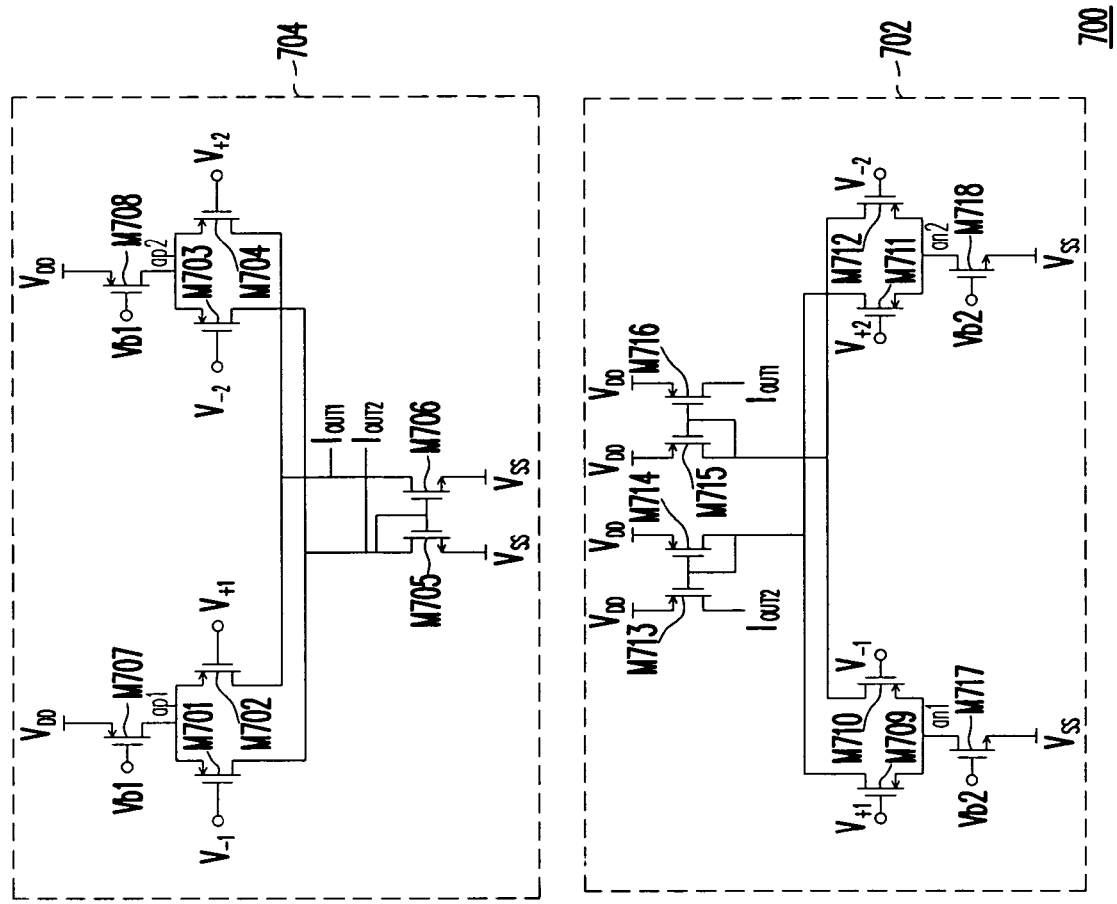
FIG. 7 is circuit diagram of an operational amplifying device having two differential input pairs according to one embodiment of the present invention.
Figure 7:
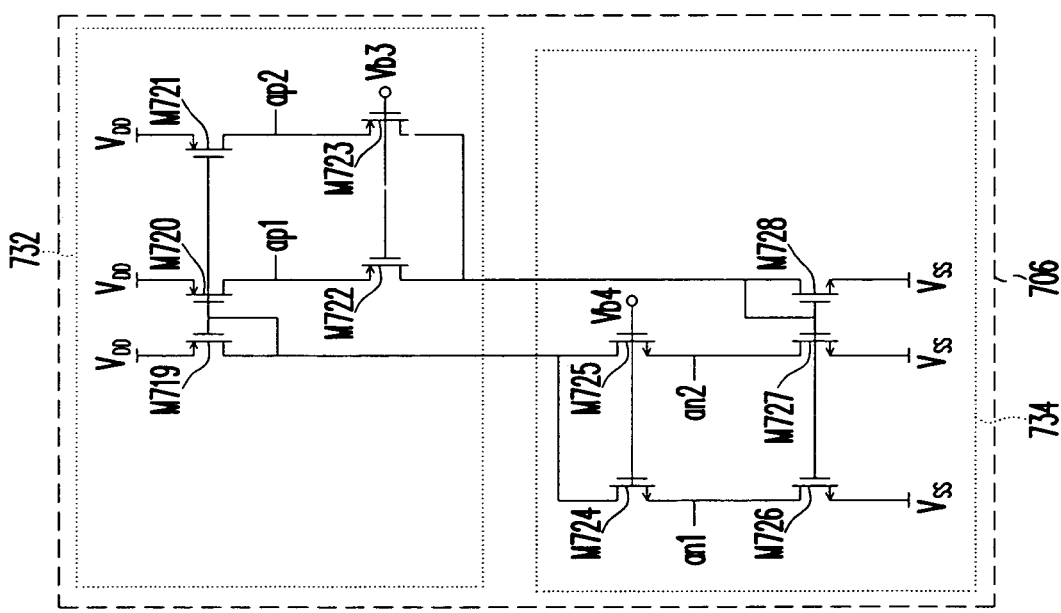

FIG. 7 is circuit diagram of an operational amplifying device having two differential input pairs according to one embodiment of the present invention. The operational amplifying device in FIG. 7 is an embodiment of the operational amplifying device 400 in FIG. 4. As shown in FIG. 7, the operational amplifying device 700 comprises a first operational amplifier 702, a second operational amplifier 704 and a converter 706 corresponding to the first operational amplifier 402, the second operational amplifier 404 and the converter 406 in FIG. 4. The method of connection is also identical or similar to the one in FIG. 4.

As shown in FIG. 7, the operational amplifier 704 includes a differential input pair of M701 and M702, a current source M707, another differential input pair of M703 and M704, another current source M708 and a pair of transistors M705 and M706, for example. The signal Vb1 can be used to set the qunatity of the tail current of the transistors M707 and M708. The current source M707 can provide a tail current passing through a node ap1 and reaching to the differential input pair of M701 and M702. The differential input pair of M701 and M702 utilizes the differential signals (the signals $V_{+1}$ and $V_{-1}$) received by their gates to divide the tail current from the transistor M707. The current source M708 can provide another tail current passing through another node ap2 and reaching to the differential input pair of M703 and M704. The differential input pair of M703 and M704 utilizes the differential signals (the signals $V_{+2}$ and $V_{-2}$) received by their gates to divide the tail current from the transistor M708. The transistors M705 and M706 are used for receiving signals from the differential input pair of M701 and M702 and signals from the differential input pair of M703 and M704 to generate a corresponding difference signal.

The operational amplifier 702 includes a differential input pair of M709 and M710, a current source M717, another differential input pair of M711 and M712, another current source M718 and a pair of transistors M713 and M716, for example. The signal Vb2 can be used to set the size of the tail current of the transistors M717 and M718. The current source M717 can provide a tail current passing through a node an1 to the differential input pair of M709 and M710. The differential input pair of M709 and M710 utilizes the differential signals (the signals $V_{+1}$ and $V_{-1}$) received by their gates to divide the tail current from the transistor M717. The current source M718 provides another tail current passing through another node an2 to the differential input pair of M711 and M712. The differential input pair of M711 and M712 utilizes the differential signals (the signals $V_{+2}$ and $V_{-2}$) received by their gates to divide the tail current from the transistor M718. The transistor M714 among the transistors M713 to M716 is used for receiving the current flowing through the transistors M709 and M711 and then transmitting to the transistor M705 via the transistor M713. Meanwhile, the transistor M715 is used for receiving the current flowing through the transistors M710 and M712 and then transmitting to the transistor M706 via the transistor M716.

The converter 706 comprises a first current mirroring device 732 (including transistors M719 to M723) and a second current mirroring device 734 (including transistors M724 to M728). The source terminal of the transistors M719 to M721 in the first current mirroring device 732 are connected to the highest input power voltage (for example, the voltage $V_{DD}$ in FIG. 7) of the operational amplifying device 700. The gate and the drain of the transistor M719 arc connected together. The drain terminal of the transistors M720 and M721 are connected to the respective node ap1 and ap2 and then connected to the gate and the drain of the transistor M728 through respective transistors M722 and M723. In addition, the gate of the transistors M722 and M723 are connected to the signal terminal Vb3.

The source terminals of the transistors M726 to M728 in the second current mirroring device 734 are connected to the lowest input power voltage (for example, the voltage $V_{SS}$ in FIG. 7) of the operational amplifying device 700. In one embodiment of the present invention, the voltage $V_{SS}$ can be a ground voltage at 0V. The gate and the drain of the transistor M728 are connected together. The drain terminals of the transistors M726 and M727 are respectively connected to the nodes an1 and an2 and then connected to the gate and the drain of the transistor M719 through corresponding transistors M724 and M725. In addition, the gates of the transistors M724 and M725 are connected to the signal terminal Vb4.

The sources of the transistors M722 and M723 are respectively connected to the nodes ap1 and ap2, and the signal Vb3 can be used to set the time for channeling the tail current of the transistors M707 and M708 into the transistor M728. When the voltage difference between the signal Vb3 and the nodes ap1 and ap2 is greater than the threshold voltage of the transistors M722 and M723, the tail current of the transistors M707 and M708 will flow into the transistor M728 through the transistors M722 and M723. Hence, the current flowing into the transistor M728 is twice of the current flowing through the transistors M722 and M723.

The sources of the transistors M724 and M725 are respectively connected to the nodes an1 and an2, and the signal Vb4 can be used to set the time for channeling the tail current of the transistors M717 and M718 into the transistor M719. When the voltage difference between the signal Vb4 and the nodes an1 and an2 is greater than the threshold voltage of the transistors M724 and M725, the tail current of the transistors M717 and M718 will flow into the transistor M719 through the transistors M724 and M725. Hence, the current flowing into the transistor M719 is twice of the current flowing through the transistors M724 and M725.

Therefore, if the external ratio of the transistors M719: M720: M721 and the external ratio of the transistors M726: M727: M728 are 1:1.5:1.5, the out-flowing compensating current is then three times of the original tail current. When this compensating current is fed to the differential input pair, a substantially constant transconductance can be obtained.

When the common mode signal $V_{com}$ of the differential signal is between the highest input power voltage and the lowest input power voltage of the operational amplifying device 700, the operational amplifiers 702 and 704 are conducted. Since the voltage difference between the nodes ap1 and ap2, and the signal Vb3 is smaller than the threshold voltage of the transistors M722 and M723, the tail current of the current sources M707 and M708 cannot be channeled. Similarly, the voltage difference between the nodes an1 and an2, and the signal Vb4 is smaller than the threshold voltage of the transistors M724 and M725, the tail current of the current sources M717 and M718 cannot be channeled. Hence, the transconductance of the four differential input pairs is gm and the total transconductance is 4 gm.

When the common mode signal Vcom is high enough to approach the highest input power voltage of the operational amplifying device 700, the operational amplifier 704 does not conduct. Consequently, the voltage at the nodes ap1 and ap2 is greater than Vb3 and greater than the threshold voltage of the transistors M722 and M723. If the quantity of the tail current of the transistors M707 and M708 is I, the tail current I flows to the transistor M728 through the transistors M722 and M723 and continuously flows to the corresponding nodes an1 and an2 through the transistors M726 and M727. The current passing through the transistor M728 is 2 I and the current passing through the transistors M726 and M727 is 3 I. Therefore, the current flowing through the nodes an1 and an2 to the differential input pair of M709 and M710 and the differential input pair of M711 and M712 is 3 I. In addition, the tail current I of the current source M717 and M718 can maintain the transconductance of the differential input pair of M709 and M710 and the differential input pair of M711 and M712 at 2 gm. Hence, the total transconductance is 4 gm.

When the common mode signal Vcom is low enough to approach the lowest input power voltage of the operational amplifying device 700, the operational amplifier 702 does not conduct. Consequently, the voltage at the nodes an1 and an2 is lower than Vb4 and greater than the threshold voltage of the transistors M724 and M725. If the quantity of the tail current of the transistors M717 and M718 is I, the tail current I flows to the transistor M719 through the transistors M724 and M725 and continuously flows to the corresponding nodes ap1 and ap2 through the transistors M720 and M721. The current passing through the transistor M719 is 2 I and the current passing through the transistors M720 and M721 is 3 I. Therefore, the current flowing through the nodes ap1 and ap2 to the differential input pair of M701 and M702 and the differential input pair of M703 and M704 is 3 I. In addition, the tail current I of the current source M707 and M708 can maintain the transconductance of the differential input pair of M701 and M702 and the differential input pair of M703 and M704 at 2 gm. Hence, the total transconductance is 4 gm.

As shown in FIG. 7, the converter 706 with two differential input pairs only has two main current paths and 10 transistors. Therefore, comparing with the converter 506 in FIG. 5, two main current paths and two transistors in total are saved.

Figure 8:
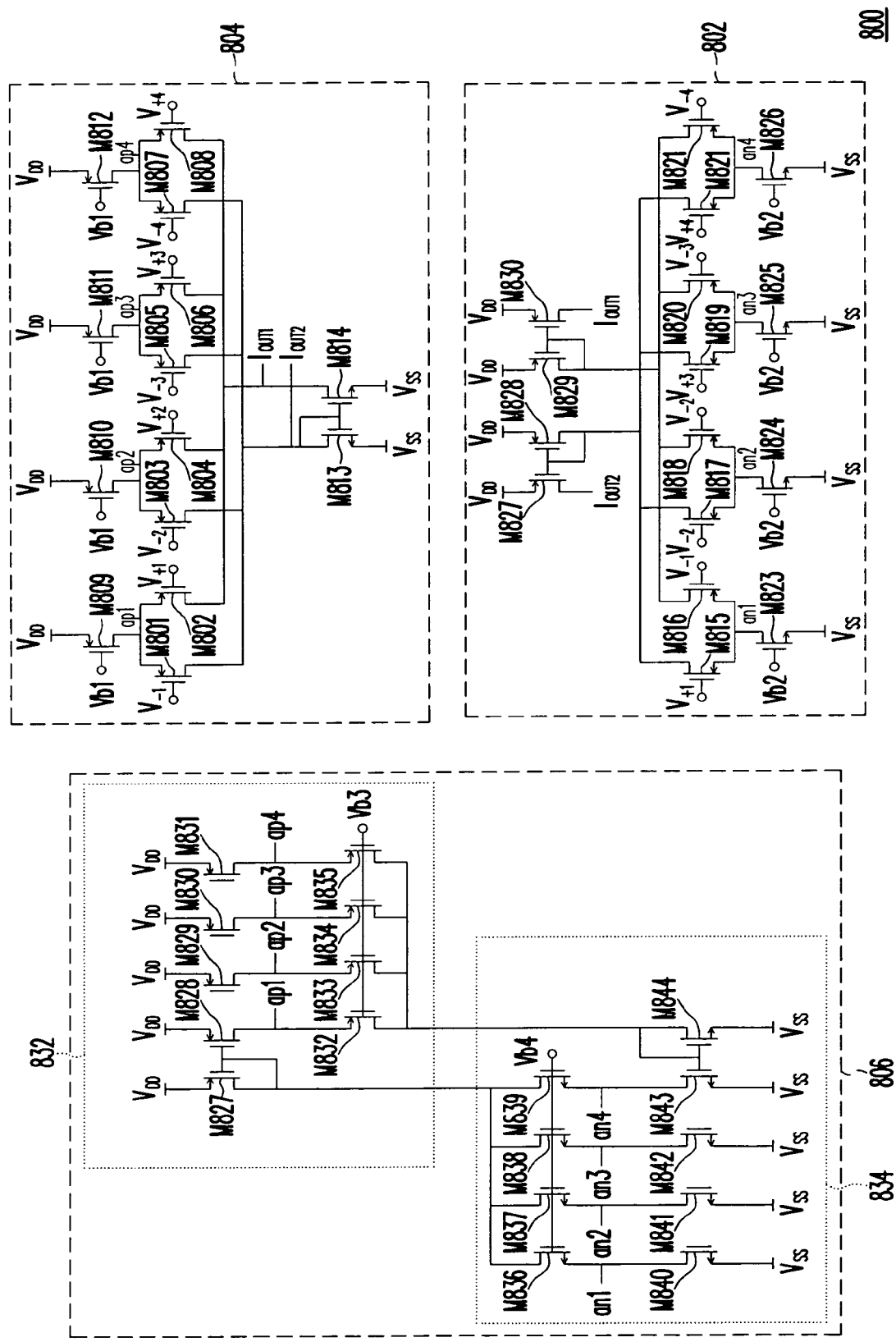
FIG. 8 is a circuit diagram of an operational amplifying device having four differential input pairs according to another embodiment of the present invention.

FIG. 8 is a circuit diagram of an operational amplifying device having four differential input pairs according to another embodiment of the present invention. As shown in FIG. 8, the converter 806 only has 2 main current paths and 18 transistors. Therefore, compared with the converter 606 in FIG. 6, 6 current paths and 6 transistors in total are saved.

In summary, as shown in FIGS. 3, 5 and 6, the converter of an operational amplifying device having N differential input pairs (where N is a positive integer) requires 2N main circuit paths and 6N transistors. In addition, as shown in FIGS. 3, 7 and 8, the converter of an operational amplifying device having N differential input pairs (where N is a positive integer) requires only two main current paths and 4N+2 transistors. In other words, the first or the second current mirroring device at most requires 2N+1 transistors.

In conclusions, the present invention provides a converter having a first current mirroring device and a second current mirroring device. The first current mirroring device is connected to a first amplifier and the tail current from the first amplifier is used as a control whether to convert the tail current to a second amplifier. Similarly, the second current mirroring device is connected to the second amplifier and the tail current from the second amplifier is used as a control whether to convert the tail current to the first amplifier. In one embodiment of the present invention, only two current paths are required between the first current mirroring device and the second current mirroring device. Furthermore, the number of devices constituting the converter and hence the layout area is reduced. Moreover, the converter in the present invention is capable of maintaining the transconductance of the amplifying device at a substantially constant value. Therefore, the amplifying device in the present invention not only provides a rail-to-rail input, but also has a substantially constant transconductance.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A converter for an amplifying device with a differential difference input pair having a first amplifier and a second amplifier, wherein the first amplifier and the second amplifier have a first tail current and a second tail current respectively, the converter comprising:

a first compensating device, connected to the first amplifier for receiving the first tail current, and the first tail current controlling whether to convert the first tail current to the second amplifier; and a second compensating device connected to the second amplifier for receiving the second tail current and the second tail current controlling whether to convert the second tail current to the first amplifier;

wherein two current paths are included between the first compensating device and the second compensating device, and the converter can maintain the transconductance of the amplifying device at a substantially constant value.

2. The converter of claim 1, wherein the amplifying device includes a rail-to-rail input amplifying device.

3. The converter of claim 1, wherein the first compensating device does not operate but the second tail current of the second compensating device is converted to the second amplifier when a common mode signal of the input signal of the amplifying device is within a first range.

4. The converter of claim 1, wherein the second compensating device does not operate but the first tail current of the first compensating device is converted to the second amplifier when a common mode signal of the input signal of the amplifying device is within a second range.

5. The converter of claim 1, wherein the first compensating device and the second compensating device do not operate when a common mode signal of the input signal of the amplifying device is between the first range and the second range.

6. The converter of claim 1, wherein the first compensating device or the second compensating device includes a current mirroring device.

7. The converter of claim 1, wherein a number of transistors included in the first compensating device or the second compensating device is smaller than or equal to 2N+1.

8. An amplifying device, comprising:

a first amplifier having N differential input pairs and at least an output terminal, wherein N is a positive integer and the first amplifier has a first tail current;

a second amplifier having N differential input pairs and at least an output terminal, wherein the differential input pairs of the first amplifier are connected to corresponding the differential input pairs of the second amplifier, the output terminal of the first amplifier is connected to the differential input pairs of the second amplifier, and the second amplifier has a second tail current; and a converter comprising a first compensating device and a second compensating device, wherein the first compensating device is connected to the first amplifier for receiving the first tail current and being controlled to determine whether to convert the first tail current to the second amplifier; the second compensating device is connected to the second amplifier for receiving the second tail current and being controlled to determine whether to convert the second tail current to the first amplifier, and two current paths are included between the first compensating device and the second compensating device and the converter is used to maintain a transconductance of the amplifying device at a substantially constant value.

9. The amplifying device of claim 8, wherein the amplifying device includes a rail-to-rail input amplifying device.

10. The amplifying device of claim 8, wherein the first compensating device does not operate but the second tail current of the second compensating device is converted to the second amplifier when a common mode signal of the input signal of the amplifying device is within a first range.

11. The amplifying device of claim 8, wherein the second compensating device does not operate but the first tail current of the first compensating device is converted to the second amplifier when a common mode signal of the input signal of the amplifying device is within a second range.

12. The amplifying device of claim 8, wherein the first compensating device and the second compensating device do not operate when a common mode signal of the input signal of the amplifying device is between the first range and the second range.

13. The amplifying device of claim 8, wherein the first compensating device or the second compensating device includes a current mirroring device.

14. The amplifying device of claim 8, wherein the number of transistors included in the first compensating device or the second compensating device is smaller or equal to 2N+1.

15. The amplifying device of claim 8, wherein each of the first amplifier and the second amplifier includes an amplifier or an operational amplifier.

16. The amplifying device of claim 8, wherein the amplifier or operational amplifier includes a differential amplifier, a differential difference amplifier, a transconductance amplifier or a voltage amplifier.

* * * * *